US012637784B2

(12) United States Patent
Bae et al.

(10) Patent No.: US 12,637,784 B2
(45) Date of Patent: *May 26, 2026

(54) APPARATUS FOR CONTINUOUSLY GROWING INGOT

(71) Applicants: HANWHA SOLUTIONS CORPORATION, Seoul (KR); HANWHA CORPORATION, Seoul (KR)

(72) Inventors: Dong Woo Bae, Seoul (KR); Kyung Seok Lee, Seoul (KR); Young Min Lee, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 168 days.

This patent is subject to a terminal disclaimer.

(21) Appl. No.: 18/028,261

(22) PCT Filed: Sep. 3, 2021

(86) PCT No.: PCT/KR2021/011930
§ 371 (c)(1),
(2) Date: Mar. 24, 2023

(87) PCT Pub. No.: WO2022/065736
PCT Pub. Date: Mar. 31, 2022

(65) Prior Publication Data
US 2023/0407518 A1 Dec. 21, 2023

(30) Foreign Application Priority Data

Sep. 24, 2020 (KR) ........................ 10-2020-0123636

(51) Int. Cl.
*C30B 15/20* (2006.01)
*C30B 15/00* (2006.01)
(Continued)

(52) U.S. Cl.
CPC ............ *C30B 15/12* (2013.01); *C30B 15/002* (2013.01); *C30B 15/02* (2013.01); *C30B 15/14* (2013.01); *C30B 29/06* (2013.01)

(58) Field of Classification Search
CPC ....... C30B 15/002; C30B 15/02; C30B 15/12; C30B 15/14; C30B 29/06
See application file for complete search history.

(56) References Cited

U.S. PATENT DOCUMENTS 3,135,585 A * 6/1964 Dash ........................ H01L 21/00
117/936
4,282,184 A 8/1981 Fiegl et al.
(Continued)

FOREIGN PATENT DOCUMENTS

CN 101089233 A 12/2007
CN 202297856 U * 7/2012
(Continued)

OTHER PUBLICATIONS

International Search Report for PCT/KR2021/011930 dated Dec. 23, 2021.
(Continued)

*Primary Examiner* — Hua Qi
(74) *Attorney, Agent, or Firm* — Sughrue Mion, PLLC

(57) ABSTRACT

An apparatus for continuously growing an ingot includes a growth furnace in which a main crucible where silicon in a molten state is accommodated is located therein to form an ingot; a material supply part for supplying a silicon material in a solid state before the silicon in a molten state is melted; and a preliminary melting part including a preliminary
(Continued)

crucible for melting the silicon material in a solid state which is supplied from the material supply part, a heating space in which the preliminary crucible can be heated, and a preliminary crucible heating module for heating the preliminary crucible by an induction heating method, where the silicon in a molten state in the preliminary crucible can be directly supplied to the main crucible.

9 Claims, 14 Drawing Sheets

(51) Int. Cl.

| | | |
|---|---|---|
| *C30B 15/02* | (2006.01) | |
| *C30B 15/12* | (2006.01) | |
| *C30B 15/14* | (2006.01) | |
| *C30B 29/06* | (2006.01) | |

(56) References Cited

U.S. PATENT DOCUMENTS

2004/0194694 A1* 10/2004 Sugiyama ........... C23C 16/4412
117/200

2005/0279275 A1* 12/2005 Holder .................... C30B 29/06
117/211
2018/0066377 A1* 3/2018 Hayashi .................. C30B 15/04

FOREIGN PATENT DOCUMENTS

| | | | |
|---|---|---|---|
| CN | 216237373 U | | 4/2022 |
| JP | 11-092276 A | | 4/1999 |
| JP | 2003201197 A | * | 7/2003 |
| JP | 2015-137210 A | | 7/2015 |
| JP | 2017-200868 A | | 11/2017 |
| KR | 10-2013-0063675 A | | 6/2013 |
| KR | 10-1408664 B1 | | 6/2014 |
| KR | 10-2015-0140589 A | | 12/2015 |
| WO | 2022/065736 A1 | | 3/2022 |

OTHER PUBLICATIONS

Chinese Office Action dated Nov. 29, 2024 in Application No. 202011404236.3.
Malaysian Office Action dated Jul. 11, 2025 in Application No. PI2023001592.
Communication dated Nov. 14, 2025, issued in Indian Application No. 202317029096.

* cited by examiner (a)                                        (b)

(a)                              (b)

APPARATUS FOR CONTINUOUSLY GROWING INGOT

CROSS REFERENCE TO RELATED APPLICATIONS

This application is a National Stage of International Application No. PCT/KR2021/011930 filed Sep. 3, 2021 claiming priority to and the benefit of Korean Patent Application No. 10-2020-0123636, filed on Sep. 24, 2020, the disclosure of which is incorporated herein by reference in its entirety.

TECHNICAL FIELD

The present invention relates to an apparatus for continuously growing an ingot, and more particularly to an apparatus for continuously growing an ingot which is capable of melting a silicon material in a solid state by means of an induction heating method, and supplying the molten silicon material to a main crucible.

BACKGROUND ART

In general, the Czochralski crystal growth method is mainly used as a method of manufacturing an ingot for manufacturing a single-crystal silicon wafer for semi conductors.

In the Czochralski crystal growth method, silicon is placed in a crucible, and the crucible is heated to melt the silicon. In addition, when a single crystal seed is rotated and simultaneously pulled upward while the molten silicon is in contact with the single crystal seed, an ingot having a predetermined diameter is grown. Among these Czochralski methods, the continuous Czochralski method (CCz) is a method of continuously growing an ingot while supplementing the consumed silicon in a molten state by continuously injecting a silicon material (polysilicon) in a solid state into the crucible.

The conventional continuous Czochralski method uses a double-shaped crucible to directly melt a silicon material in a solid state in the crucible, but this double-shaped crucible has a problem in that the manufacturing cost of the ingot forming apparatus increases.

In addition, silicon has been directly supplied by quantitatively injecting the silicon material in a solid state into the crucible, but when the silicon material in a solid state is supplied in this way, there is a problem in that the silicon in a molten state is splashed inside the main crucible.

DISCLOSURE

Technical Problem

According to the present invention, it is directed to providing an apparatus for continuously growing an ingot which is capable of melting a silicon material in a solid state by an induction heating method, and supplying the molten silicon material to a main crucible.

Technical Solution

The apparatus for continuously growing an ingot according to an aspect of the present invention may include a growth furnace in which a main crucible where silicon in a molten state is accommodated is located therein to form an ingot; a material supply part for supplying a silicon material in a solid state before the silicon in a molten state is melted; and a preliminary melting part which includes a preliminary crucible for melting the silicon material in a solid state which is supplied from the material supply part, a heating space in which the preliminary crucible can be heated, and a preliminary crucible heating module for heating the preliminary crucible by an induction heating method, wherein the silicon in a molten state in the preliminary crucible may be directly supplied to the main crucible.

In this case, the preliminary crucible heating module may include an induction coil which is disposed to surround the heating space and heats the preliminary crucible by using an induction current.

In this case, the preliminary crucible may include a body in the form of a container disposed inside the heating space and opened upward to accommodate the silicon material in a solid state, and a beak which is disposed outside the other side of the heating space such that the silicon in a molten state is supplied to the main crucible.

In this case, the induction coil may be wound along the periphery of the heating space, and may be tightly wound such that a gap between the induction coils that are disposed adjacent to each other along a direction from one side of the heating space to the other side is reduced.

In this case, the induction coil may be wound along the periphery of the heating space such that the inner diameter of the induction coil disposed on the other side of the heating space is smaller than the inner diameter of the induction coil disposed on one side of the heating space.

In this case, the apparatus may further include a power connector which is electrically connected to supply current to the induction coil, wherein the induction coil may be provided with a fastening bracket which is inserted and fixed to the power connector.

In this case, the preliminary crucible may be movable between a first position for accommodating the silicon material in a solid state and a second position for supplying the silicon in a molten state to the main crucible, and wherein in the first position, a first inclination may be formed in the upper direction of the preliminary crucible.

In this case, a second inclination may be formed in the induction coil along a winding direction, and wherein when the preliminary crucible is located in the first position, the first inclination and the second inclination may be formed to be the same as each other.

In this case, in the second position, the preliminary crucible may be formed with an inclination in the downward direction such that the silicon in a molten state inside the preliminary crucible flows toward the main crucible.

In this case, the preliminary crucible may be provided with a front support bar and a rear support bar for respectively supporting one side and the other side, and wherein when the preliminary crucible is moved from the first position to the second position, the rear support bar may be formed to move upward while the height of the front support bar is fixed.

In this case, the preliminary crucible heating module may further include a shield for surrounding an outer peripheral surface of the induction coil and an insulating material for blocking heat exchange between the preliminary crucible and the induction coil.

In this case, the preliminary crucible heating module may further include a heating tube which is disposed to surround the preliminary crucible and is formed to extend along a winding direction of the induction coil, and wherein the insulating material may be disposed between the heating tube and the induction coil.

In this case, the thickness of the insulating material may be formed in the range of 13 mm or more and 40 mm or less.

Advantageous Effects

According to the above configuration, the apparatus for continuously growing an ingot according to an aspect of the present invention melts a silicon material in a solid state in the preliminary melting part and supplies the silicon in a molten state to the main crucible, and thus, the configuration of the main crucible is simplified, and it is possible to prevent the splashing of silicon in a molten state, and particularly, since the preliminary melting part heats the preliminary crucible by an induction heating method, the configuration of the entire apparatus can be simplified.

In addition, the apparatus for continuously growing an ingot according to an aspect of the present invention is wound such that the induction coil surrounds the heating space, and the interval of the induction coil is densely wound or is wound such that the inner diameter is reduced, and thus, it is possible to effectively heat all parts of the preliminary crucible.

Further, in the apparatus for continuously growing an ingot according to an aspect of the present invention, an insulating material is provided between the induction coil and the preliminary crucible, and the thickness of the insulating material is formed within a certain range to minimize heat loss and maximize the heating efficiency of the preliminary crucible.

MODES OF THE INVENTION

Figure 1:
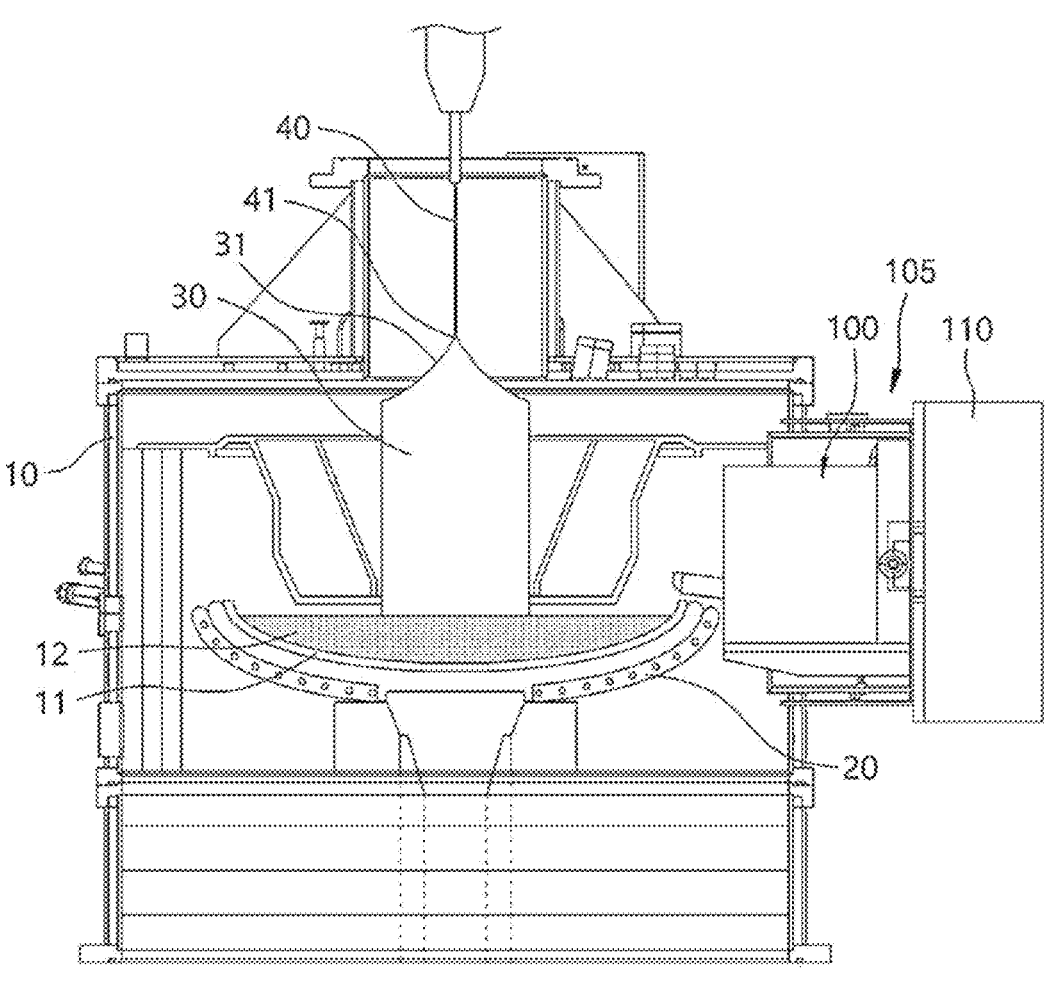
FIG. 1 is a cross-sectional view illustrating the apparatus for continuously growing an ingot according to an exemplary embodiment of the present invention.

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the exemplary embodiments described in the present specification and the configurations shown in the drawings correspond to preferred exemplary embodiments of the present invention, and do not represent all the technical spirit of the present invention, and thus, the configurations may have various examples of equivalent and modification that can replace them at the time of filing the present invention.

It is understood that the terms "include" or "have", when used in the present specification, are intended to describe the presence of stated features, integers, steps, operations, elements, components and/or a combination thereof but do not preclude the possibility of the presence or addition of one or more other features, integers, steps, operations, elements, components or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the apparatus for continuously growing an ingot according to the present invention will be described with reference to the drawings. FIG. 1 is a cross-sectional view illustrating the apparatus for continuously growing an ingot according to an exemplary embodiment of the present invention. In the present specification, in terms of describing the apparatus for growing an ingot according to an exemplary embodiment of the present invention, configurations that are not related to the contents of the invention are not illustrated in detail or are omitted for the sake of simplifying the drawings, and the apparatus for growing an ingot according to the present invention will be described by focusing on contents related to the spirit of the invention.

As illustrated in FIG. 1, the apparatus for continuously growing an ingot according to an exemplary embodiment of the present invention may include a growth furnace 10 in which the main crucible 11 where silicon 12 in a molten state is accommodated to form an ingot 30 is located therein.

A bottom heater 20 for maintaining an appropriate temperature of the silicon 12 in a molten state which is accommodated in the main crucible 11 may be provided, and such a bottom heater 20 may be configured to provide a separate magnetic field to control the oxygen concentration by causing circulating convection to occur in the silicon 12 in a molten state, and the temperature and magnetic field of the bottom heater 20 are maintained to be constant according to the temperature and magnetic field profile which are determined during the growth of the ingot 30.

In this state, a separate pulling device part (not illustrated) rotates and pulls a pulling wire 40 in a lowered state such that a seed 41 at the bottom of a pulling wire comes into contact with the silicon 12 in a molten state.

In this case, the rotation speed and the pulling speed of the pulling wire 40 are maintained uniformly according to the rotation and pulling speed profile that have already been determined in the entire process.

When the pulling wire 40 is moved upward, the upper side of the ingot 30 inclined downward from the seed 41 is crystallized, and as the upward movement continues, after the upper side of the ingot 30, which is commonly referred to as a shoulder portion 31, is formed, the height of the crystallized ingot 30 gradually increases, and the ingot 30 grows.

A material supply part 110 which is positioned outside the growth furnace 10 may be provided to supply a silicon material in a solid state before the silicon 12 in a molten state is melted, and the material supply part 110 measures the amount of the silicon material in a solid state and supplies the same in a fixed quantity.

Figure 14:
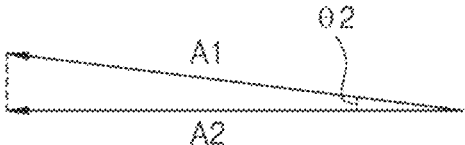
FIG. 14 is a diagram schematically illustrating an inclination of the induction coil shown in FIG. 4, according to an exemplary embodiment of the present invention.

The material supply part 110 may include a storage unit (not illustrated) in which the silicon material in a solid state is stored, a transfer module (not illustrated) for transferring the silicon material in a solid state from the storage unit, and a bucket 111 in the form of a container which is opened upward to accommodate the silicon material in a solid state which has been transferred from the transfer module, and the bucket 111 may be configured to rotate around a horizontal axis A2 inside the preliminary melting part 100, as shown in FIG. 14 of the drawings.

In addition, the material supply part 110 may be spatially connected to one side of a preliminary heating part 100, and a separate bucket transfer module (not illustrated) may be provided in the material supply part 110 to allow the bucket 111 to move between the material supply part 110 and the preliminary melting part 100.

Moreover, an openable blocking plate 105 may be provided between the material supply part 110 and the preliminary heating part 100 to prevent heat loss when the silicon material in a solid state is supplied.

The aforementioned preliminary melting part 100 may include a preliminary crucible 122 for melting the silicon material in a solid state which is supplied from the material supply part 110, and a preliminary heating part 100 which includes a heating space 120*a* in which the preliminary crucible 122 can be heated and a preliminary crucible heating module 120 for heating the preliminary crucible 122 by an induction heating method, and the silicon 12 in a molten state in the preliminary crucible 122 may be directly transferred to the main crucible 11.

As such, when the silicon material in a solid state is melted in the preliminary heating part 100 and silicon in a molten state is supplied to the main crucible 11, the configuration of the main crucible 11 may be simplified, and it is possible to prevent the splashing of silicon in a molten state. Furthermore, since the preliminary melting part 100 heats the preliminary crucible 122 by an induction heating method, the configuration of the entire apparatus can be simplified.

Figure 2:
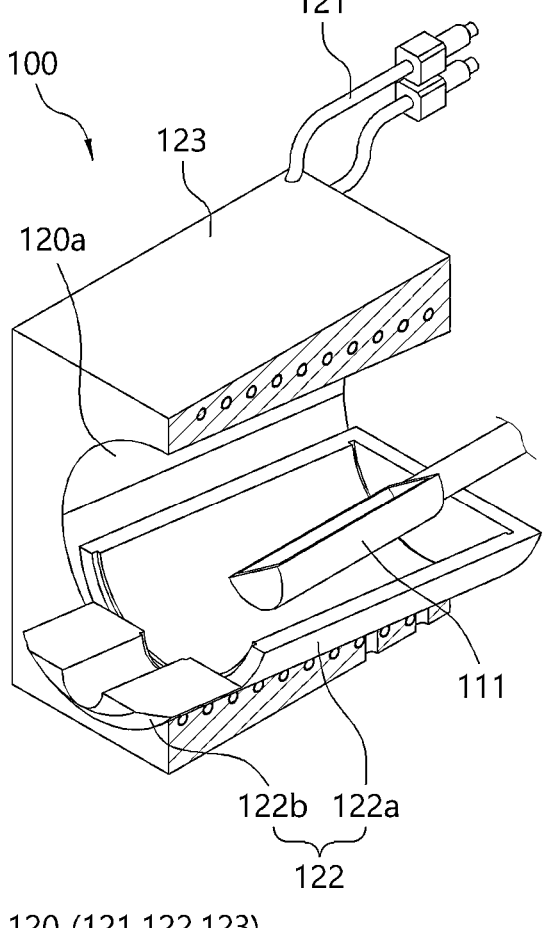
FIG. 2 is a perspective view illustrating a preliminary heating part according to an exemplary embodiment of the present invention.
Figure 3:
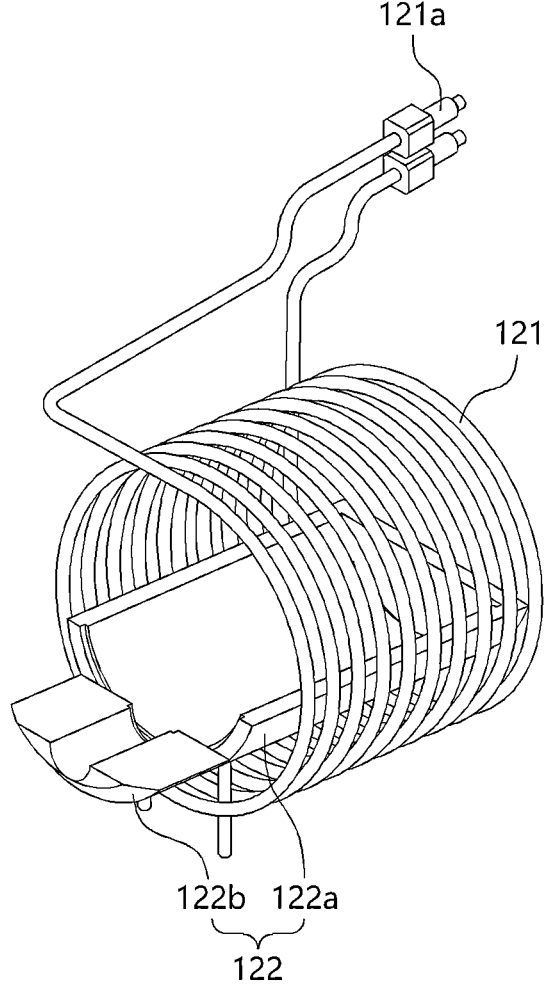
FIG. 3 is a perspective view illustrating a preliminary crucible and an induction coil according to an exemplary embodiment of the present invention.

FIG. 2 is a perspective view illustrating a preliminary heating part according to an exemplary embodiment of the present invention, and FIG. 3 is a perspective view illustrating a preliminary crucible and an induction coil according to an exemplary embodiment of the present invention.

As illustrated in FIG. 2, FIG. 3, and FIG. 14, the preliminary crucible heating module 120 may include an induction coil 121 which is wound around an axis A1 extending in the transverse direction so as to surround the heating space 120*a*, and heats the preliminary crucible 122 by using an induced current. In this case, while the blocking plate is open, the silicon material in a solid state is moved from the material supply part 110 in a direction of the preliminary crucible 122 and is introduced into one side of the heating space 120*a* such that it is supplied to the preliminary crucible 122, and after the silicon material in a solid state which is accommodated in the preliminary crucible 122 is melted, the silicon in a molten state is discharged to the other side of the heating space 120*a* while moving in a direction of the main crucible 11, and is directly supplied to the main crucible 11.

When a current is supplied to the induction coil 121, a magnetic field is generated. The magnetic field generated in the induction coil 121 generates a current in a preliminary crucible 122 or a heating tube 125 through electromagnetic induction, and the induced current generated in the preliminary crucible 122 or the heating tube 125 is converted to thermal energy. To this end, the preliminary crucible 122 or the heating tube 125 may be made of a material which is capable of generating an induced current.

If the heating tube 125 is used, it may include a graphite material. In this case, a silicon carbide (SiC) coating may be added to the graphite surface to prevent carbon contamination, or a silicon carbide (SiC) material having a resistance band which is capable of generating an induced current may be used.

In addition, the preliminary crucible 122 is not limited to being made of a graphite material, and it may be made of various materials having strong heat resistance and conductor properties.

That is, as described above, the induction coil 121 may heat the preliminary crucible 122 or the heating tube 125 by an induction heating method, and particularly, the induction coil 121 is arranged to surround the heating space 120*a* such that the heating efficiency may be maximized.

In this case, as illustrated in FIG. 2, the preliminary crucible 122 may be disposed inside the heating space 120*a* and include a container-shaped body 122*a* which is opened upward to accommodate the silicon material in a solid state, and a beak 122*b* which is disposed outside the other side of the heating space 120*a* such that the silicon 12 in a molten state is supplied to the main crucible 11.

That is, the heating tube 125 or the body 122*a* of the preliminary crucible 122 is heated by induction current which is generated as the current flows in the induction coil while the silicon material in a solid state is accommodated inside the body 122*a* through the aforementioned material supply part 110 so as to melt the silicon in a solid state, and in this way, the silicon 12 in a molten state is supplied to the main crucible 11 through the beak 122*b*. In this case, the beak 122*b* may be configured to stably supply the silicon 12 in a molten state to the main crucible 11 by being disposed outside the other side of the heating space 120*a*.

Figure 4:
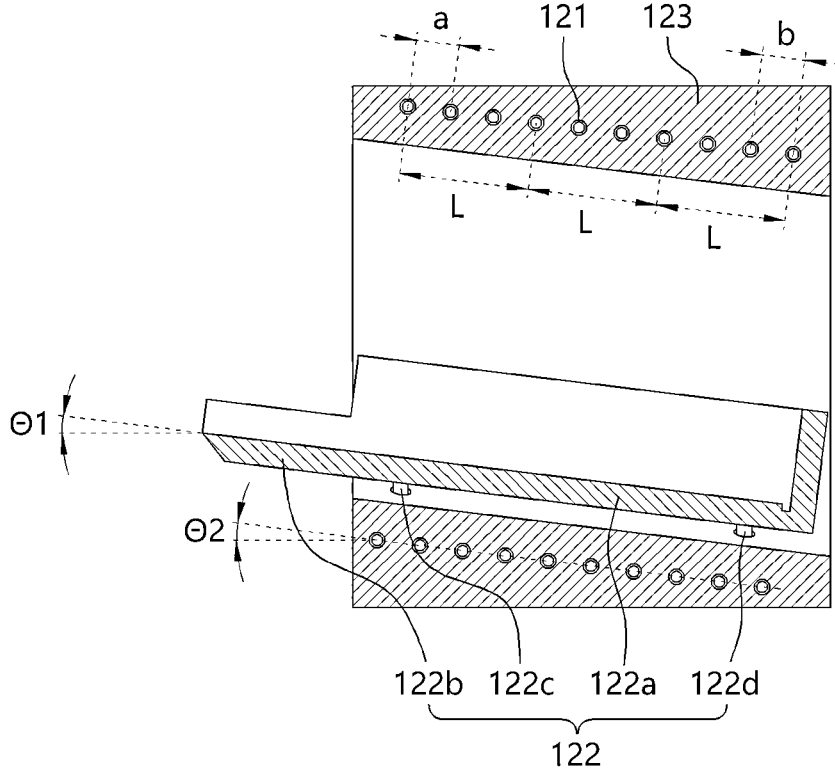
FIG. 4 is a cross-sectional view illustrating a preliminary heating part according to an exemplary embodiment of the present invention.
Figure 5:
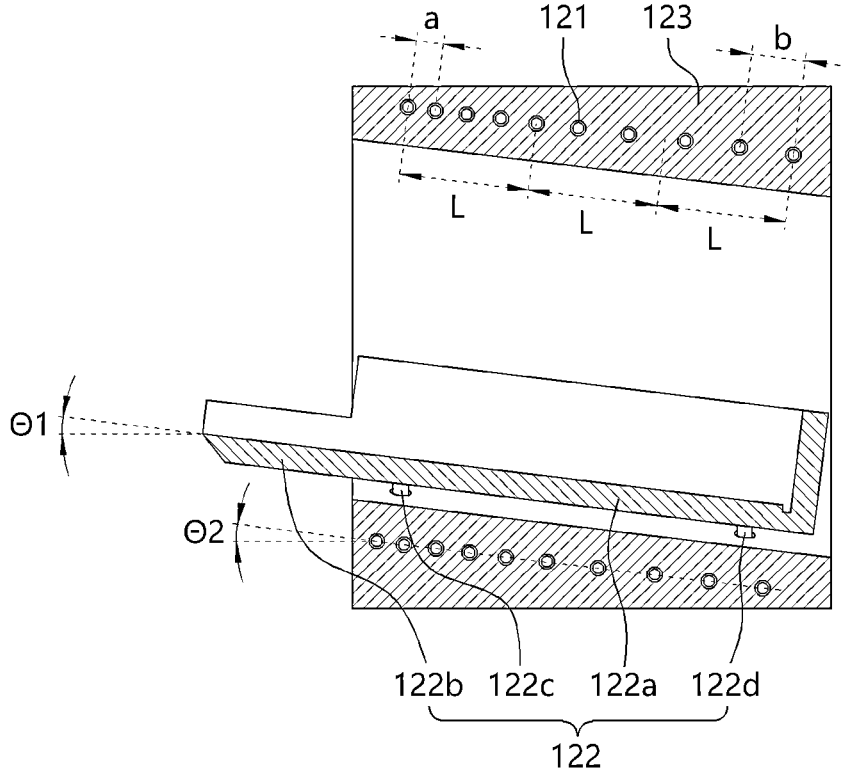
FIG. 5 is a cross-sectional view showing a preliminary heating part according to another exemplary embodiment of the present invention.
Figure 6:
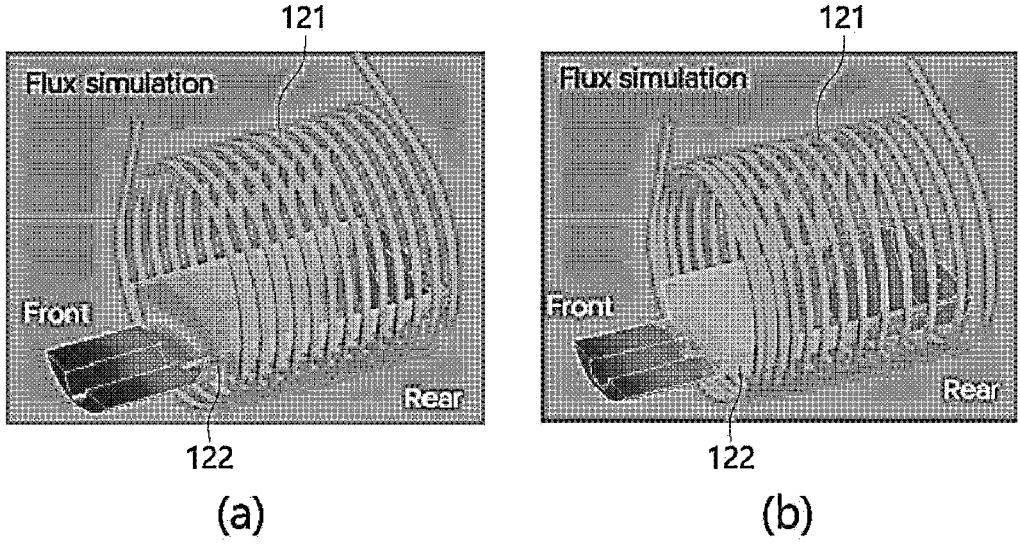
FIG. 6 is a view illustrating the temperature distribution of a preliminary crucible according to an exemplary embodiment of the present invention, wherein (a) is a diagram illustrating the temperature distribution of the preliminary crucible which is heated by induction coils that are arranged at equal intervals, and (b) is a diagram illustrating the temperature distribution of the preliminary crucible which is heated by induction coils that are arranged at unequal intervals.
Figure 7:
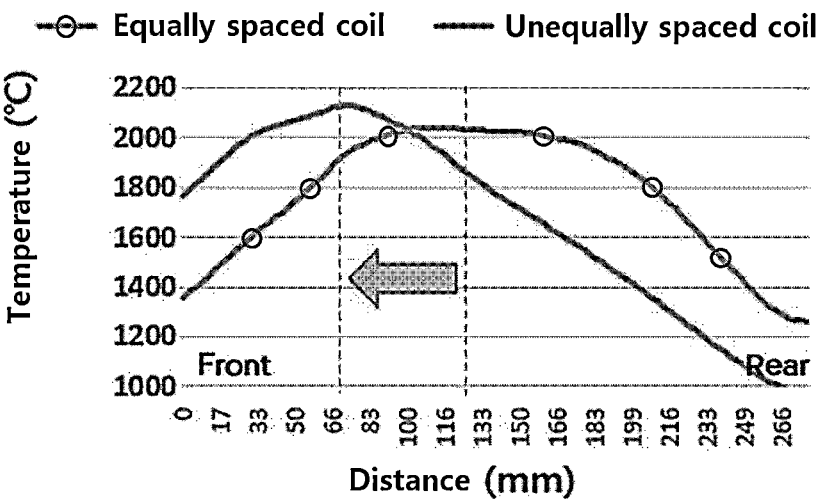
FIG. 7 is a graph showing the temperature distribution of the preliminary crucible according to FIG. 6.

FIG. 4 is a cross-sectional view illustrating a preliminary heating part according to an exemplary embodiment of the present invention, FIG. 5 is a cross-sectional view showing a preliminary heating part according to another exemplary embodiment of the present invention, FIG. 6 is a view illustrating the temperature distribution of a preliminary crucible according to an exemplary embodiment of the present invention, wherein (a) is a diagram illustrating the temperature distribution of the preliminary crucible which is heated by induction coils that are arranged at equal intervals, and (b) is a diagram illustrating the temperature distribution of the preliminary crucible which is heated by induction coils that are arranged at unequal intervals, and FIG. 7 is a graph showing the temperature distribution of the preliminary crucible according to FIG. 6.

As illustrated in FIG. 4, the aforementioned induction coil 121 may be wound at equal intervals along the periphery of the heating space 120*a*. That is, the spacing (a) between the induction coils 121 disposed on the other side of the heating space 120*a* and the spacing (b) between the induction coils 121 disposed on one side of the heating space 120*a* are formed to be the same, and when configured in this way, the number of windings (number of turns) of the induction coil 121 per a plurality of unit regions (L) formed in the heating space 120*a* becomes the same, and as illustrated in (a) of FIG. 6, it is possible to uniformly heat the body 122*a* from one side of the heating space 120*a* to the other side.

In this case, as described above, the beak 122*b* may be disposed outside the other side of the heating space 120*a* such that the silicon 12 in a molten state is stably supplied to the main crucible 11, but as the beak 122*b* is disposed outside the other side of the heating space 120*a* in this way, the degree of heating may be relatively lower than that of the body 122*a* disposed inside the heating space 120*a*, and as the silicon 12 in a molten state is solidified again in the process of moving through the beak 122*b*, there may be a problem in that the silicon 12 in a molten state is not smoothly supplied.

For this purpose, as illustrated in FIG. 5, the heating space 120*a* may be tightly wound such that the gap between the induction coils 121 disposed adjacent to each other along a direction from one side to the other side of the heating space 120*a* is reduced.

That is, it is wound such that the spacing (a) between the induction coils 121 disposed on the other side of the heating space 120*a* is formed to be smaller than the spacing (b) between the induction coils 121 disposed on one side of the heating space 120*a*, and when configured in this way, the number of windings (number of turns) of the induction coil 121 per a plurality of unit regions (L) formed in the heating space 120*a* is configured such that the number of windings of the induction coil 121 disposed in the unit region (L) formed on the other side of the heating space 120*a* is formed to be greater than the number of windings of the induction coil 121 disposed in the unit region (L) formed on one side of the heating space 120*a*.

When configured in this way, as illustrated in (b) of FIG. 6, even if the beak 122*b* is disposed outside the other side of the heating space 120*a*, it is possible to effectively heat the break 122*b*, and thus, the silicon 12 in a molten state which is supplied to the main crucible 11 may be effectively supplied without being solidified. Hereinafter, the temperature distribution of a preliminary crucible 122 according to the arrangement of the induction coil 121 will be described with reference to FIG. 7.

First of all, the total length of the preliminary crucible 122 is about 150 mm, and the temperature distribution from the other front position of the preliminary crucible 122 to about 150 mm where the one side rear is located is the temperature distribution of the preliminary crucible 122, and the beak 122*b* is formed on the other side of the preliminary crucible 122, and the body 122*a* is formed to extend in a direction toward one side of the preliminary crucible 122 in the beak 122*b*.

As described above, when the induction coil 121 is wound at equal intervals, it can be confirmed that the temperature distribution of the body 122*a* is uniformly heated to about 1,800° C. or higher.

On the other hand, when the induction coil 121 is wound at unequal intervals, although the temperature decreases toward the other end of the body 122*a*, the temperature is maintained at about 1,800° C. or higher, and thus, it is possible to smoothly melt the silicon in a solid state.

Meanwhile, when the induction coil 121 is wound at equal intervals, the temperature distribution of the beak 122*b* rapidly decreases in a direction toward the other side of the beak 122*b*, and it can be confirmed that the temperature of one end of the beak 122*b* is approximately 1,400° C.

On the other hand, when the induction coil 121 is wound at unequal intervals, the maximum temperature is formed at about 2,100° C. at a position adjacent to the beak 122*b*, and accordingly, the temperature in a direction toward the other side of the beak 122*b* partially decreases, but since the temperature of one end of the beak 122*b* is maintained at about 1,800° C., the silicon 12 in a molten state is effectively prevented from solidifying while being cooled in the process of being supplied to the main crucible 11, thereby enabling smooth supply.

Figure 8:
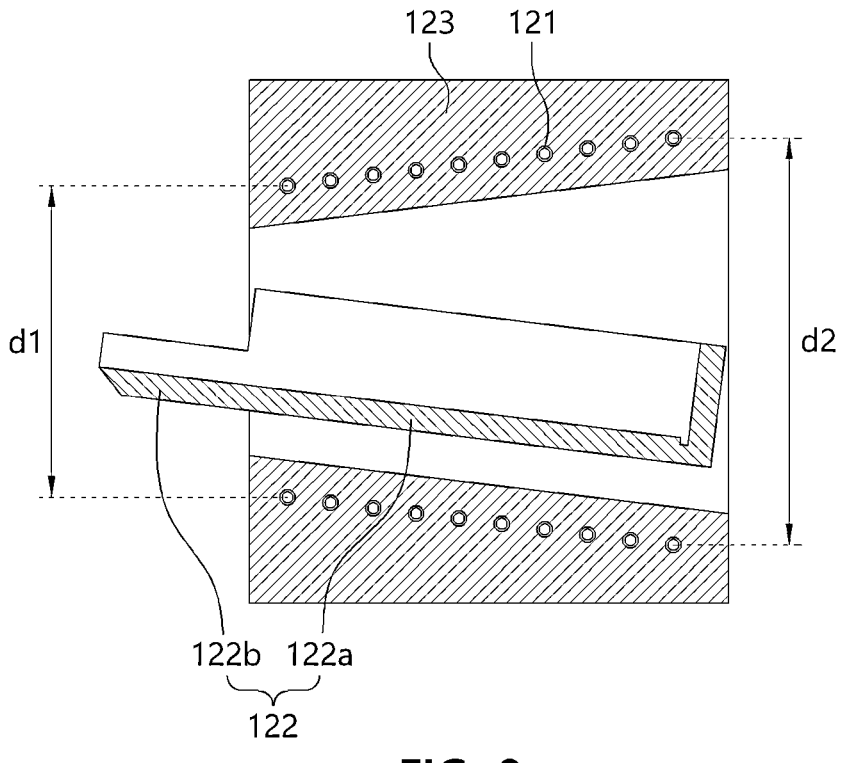
FIG. 8 is a cross-sectional view illustrating a preliminary heating part according to another exemplary embodiment of the present invention.

FIG. 8 is a cross-sectional view illustrating a preliminary heating part according to another exemplary embodiment of the present invention.

Meanwhile, as illustrated in FIG. 8, the induction coil 121 is wound along the periphery of the heating space 120*a*, and it may be wound such that the inner diameter d1 of the induction coil 121 disposed on the other side of the heating space 120*a* is smaller than the inner diameter d2 of the induction coil 121 disposed on one side of the heating space 120*a*.

That is, it is wound such that the inner diameter of the induction coil 121 decreases toward a direction in which the beak 122*b* is formed, and when configured in this way, the density of the magnetic field passing through the induction coil 121 increases at a position where the beak 122*b* is formed such that in the process of supplying the silicon 12 in a molten state to the main crucible 11, it is effectively prevented from being solidified while being cooled, thereby enabling smooth supply.

Figure 9:
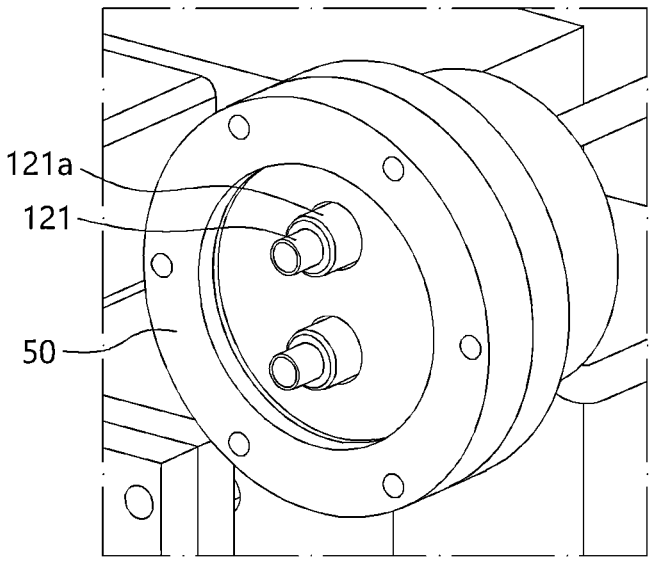
FIG. 9 is a perspective view illustrating a power connector according to an exemplary embodiment of the present invention.

FIG. 9 is a perspective view illustrating a power connector according to an exemplary embodiment of the present invention.

As illustrated in FIG. 9, the apparatus further includes a power connector 50 which is electrically connected to the induction coil 121 such that current is supplied, and the induction coil 121 may be provided with a fastening bracket 121*a* which is inserted and fixed to the power connector 50.

In the case of the induction coil 121, a high current flows continuously for induction heating of the preliminary crucible 122, and if the induction coil 121 is used for a long period of time in such a state, the durability of the induction coil 121 deteriorates, and it may be necessary to replace the same.

To this end, as described above, when the induction coil 121 is configured to be simply fastened to the power connector 50 by using the fastening bracket 121*a*, the replacement operation of the induction coil 121 is facilitated, and the operator's labor can be reduced when replacing the induction coil 121.

The outer peripheral surface of the fastening bracket 121*a* may be configured such that a separate screw thread is formed such that it can be simply fixed by using a nut.

Figure 10:
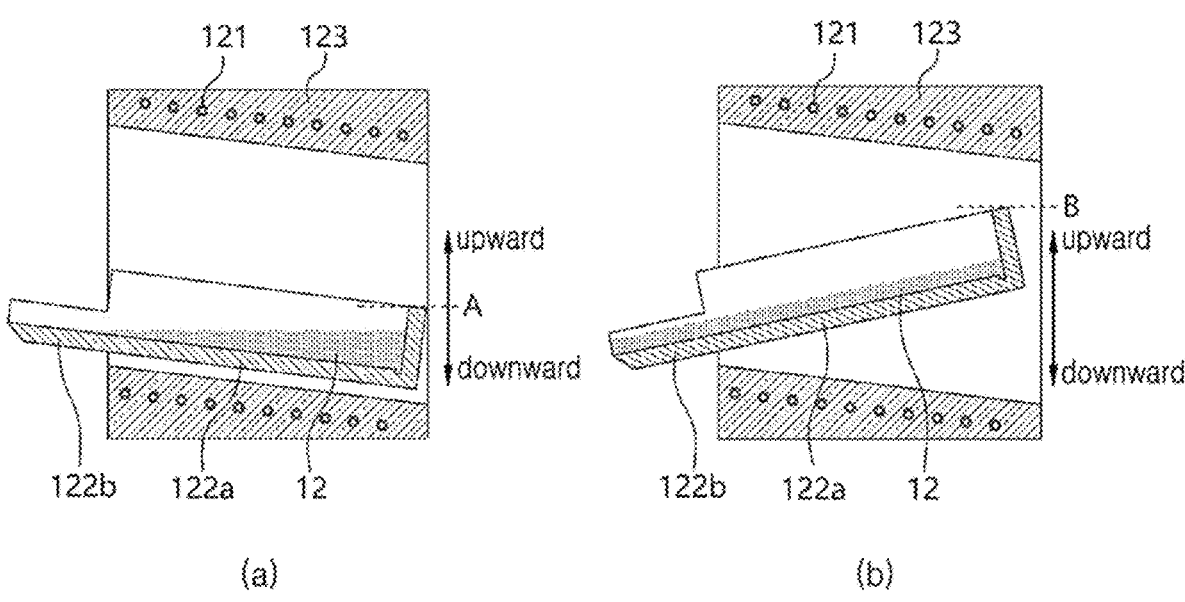
FIG. 10 is a cross-sectional view illustrating a preliminary heating part according to an exemplary embodiment of the present invention, wherein (a) is a diagram illustrating a state in which the preliminary crucible is located in the first position, and (b) is a diagram illustrating a state in which the preliminary crucible is located in the second position.

FIG. 10 is a cross-sectional view illustrating a preliminary heating part according to an exemplary embodiment of the present invention, wherein (a) is a diagram illustrating a state in which the preliminary crucible is located in the first position, and (b) is a diagram illustrating a state in which the preliminary crucible is located in the second position.

The preliminary crucible 122 is movable between a first position (a) where the silicon material in a solid state is melted, as illustrated in (a) of FIG. 10, and a second position (b) where the silicon 12 in a molten state is supplied to the main crucible 11, as illustrated in (b) of FIG. 10.

In this case, as illustrated in FIG. 4, in the first position (A), a first inclination θ1 may be formed in the preliminary crucible 122 in an upward direction. That is, as the first inclination θ1 is formed on the lower surface of the preliminary crucible 122, the silicon 12 in a molten state is stably accommodated, thereby preventing the same from being arbitrarily supplied to the main crucible 11.

In addition, as illustrated in FIGS. 4 and 14, the induction coil 121 is formed with a second inclination θ2 which is formed along the winding direction, and when the preliminary crucible 122 is located at the first position (A), the first inclination θ1 and the second inclination θ2 may be formed to be identical to each other.

That is, as described above, when the preliminary crucible 122 is positioned at the first position (A), the silicon in a solid state is melted, and thus, it is important to configure the preliminary crucible 122 to efficiently heat the preliminary crucible 122 in this state.

To this end, the induction coil 121 may also be configured to have a second inclination θ2, and this second inclination θ2 may be formed to be the same as the first inclination θ1 which is formed in the preliminary crucible 122, and thus, it is possible to effectively heat the preliminary crucible 122.

Moreover, as illustrated in (b) of FIG. 10, the preliminary crucible 122 may be formed with an inclination in the downward direction such that in the second position (B), the silicon 12 in a molten state inside the preliminary crucible 122 flows out toward the main crucible 11

That is, as the inclination is formed on the lower surface of the preliminary crucible 122 in the downward direction, the silicon 12 in a molten state may be smoothly supplied to the main crucible 11 while moving downward by gravity.

As illustrated in FIG. 4, the preliminary crucible 122 may be provided with a front support bar 122*c* and a rear support bar 122*d* for respectively supporting one side and the other side, and when the preliminary crucible 122 is moved from the first position (A) as illustrated in (a) of FIG. 10 to the second position (B) as illustrated in (b) of FIG. 10, the rear support bar 122*d* may be formed to move upward while the height of the front support bar 122*c* is fixed.

That is, the preliminary crucible 122 is configured such that the other side rotates around one side, and thus, the silicon 12 in a molten state can be supplied in a simple manner, and the rear support bar 122*d* may be connected to a separate lifting module (not illustrated) such that the rear support bar 122*d* can move upward.

Figure 11:
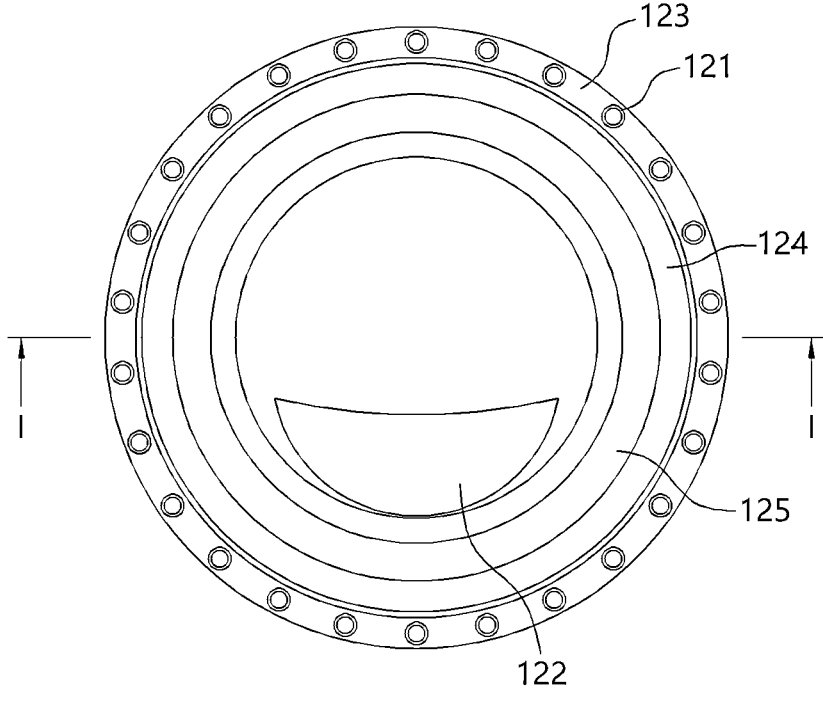
FIG. 11 is a cross-sectional view illustrating a preliminary heating part according to another exemplary embodiment of the present invention.
Figure 12:
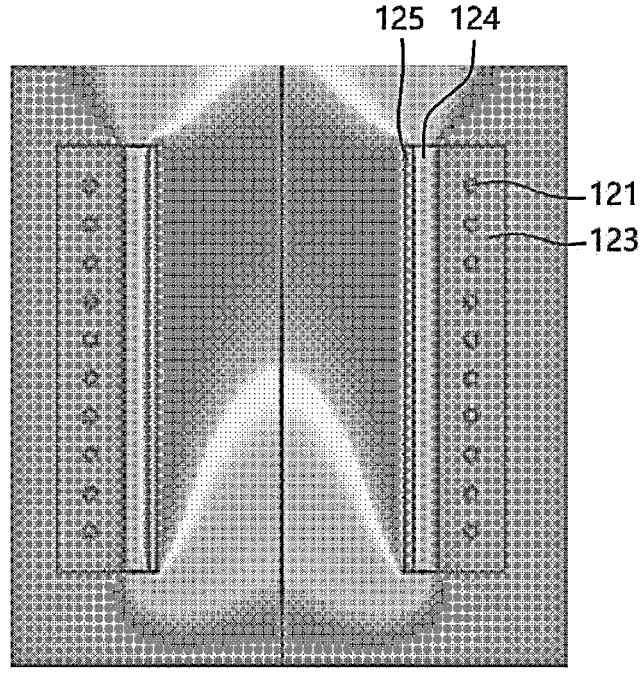
FIG. 12 is a cross-sectional view of I-I part of FIG. 11, and is a diagram illustrating the temperature distribution of a heating tube and a shield.
Figure 13:
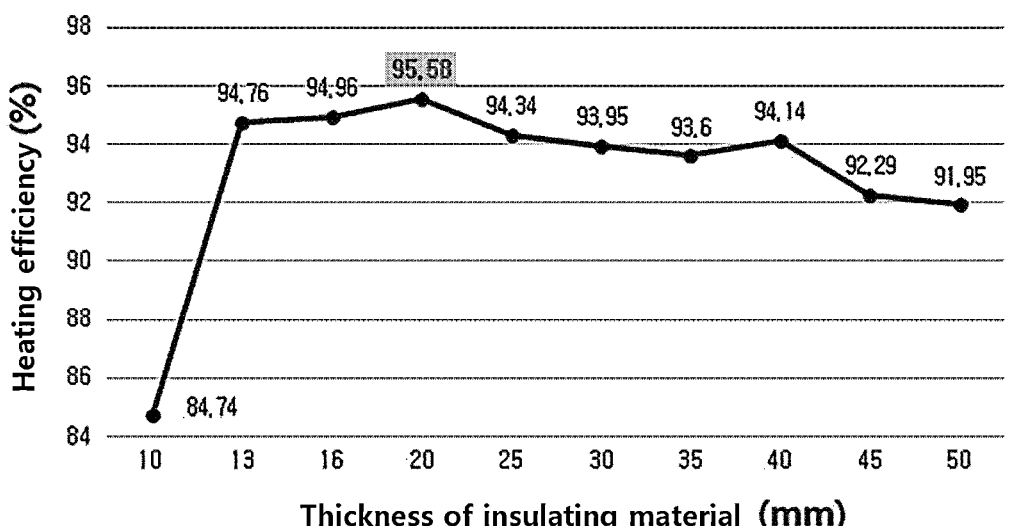
FIG. 13 is a graph showing the heating efficiency of a preliminary heating part according to another exemplary embodiment of the present invention.

FIG. 11 is a cross-sectional view illustrating a preliminary heating part according to another exemplary embodiment of the present invention, FIG. 12 is a cross-sectional view of I-I part of FIG. 11, and is a diagram illustrating the temperature distribution of a heating tube and a shield, and FIG. 13 is a graph showing the heating efficiency of a preliminary heating part according to another exemplary embodiment of the present invention.

As illustrated in FIG. 11, the preliminary crucible heating module 120 may further include a shield 123 for surrounding the outer peripheral surface of the induction coil 121, and an insulating material 124 for blocking heat exchange between the preliminary crucible 122 and the induction coil 121.

The shield 123 is formed to surround the outer peripheral surface of the induction coil 121, and may support the induction coil 121 to maintain a spiral shape. In addition, the shield 123 may block the induction coil 121 from being exposed toward the outside as well as the heating space 120*a*.

Accordingly, when a magnetic field is formed while current flows in the induction coil 121 by blocking the induction coil 121 from being exposed toward the heating space 120*a*, the shield 123 may prevent an arc discharge from occurring by a plasma phenomenon in a vacuum state or prevent an arch discharge from occurring when the induction coil 121 comes into contact with an inert gas such as argon which is present inside the heating space 120*a*.

The shield 123 may be made of a ceramic material having strong heat resistance. For example, the ceramic material may include at least one of aluminum oxide ($Al_2O_3$), silicon dioxide ($SiO_2$), zirconium dioxide ($ZrO_2$) and silicon nitride ($Si_3N_4$).

In addition, a cooling fluid for preventing the induction coil 121 itself from being heated by the current flowing through the induction coil 121 flows inside the induction coil 121, and as described above, in order to prevent the preliminary crucible 122 from being cooled by such a cooling fluid, an insulating material 124 is provided between the preliminary crucible 122 and the induction coil 121 to block heat exchange therebetween.

The insulating material 124 may include at least one of soft felt made of a carbon material, silicon dioxide ($SiO_2$), aluminum oxide ($Al_2O_3$) and zirconium dioxide ($ZrO_2$), and a fiber assembly including a certain ratio of air gaps inside or using the above material may be used.

In this case, as illustrated in FIG. 11, the preliminary crucible heating module 120 is disposed to surround the preliminary crucible 122, and it may further include a heating tube 125 which is formed to extend along the winding direction of the induction coil 121.

That is, as described above, since the induction coil 121 is circularly disposed to surround the heating space 120*a*, a heating tube 125 having a cylindrical cross-section to correspond thereto may be used to surround the preliminary crucible 122.

The heating tube 125 may include a graphite material, such as the preliminary crucible 122, and a silicon carbide (SiC) material which is capable of being heated by a silicon carbide (SiC) coating and induced current on the surface of the graphite material may be used alone. When the heating space 120*a* is formed inside the heating tube 125 and the preliminary crucible 122 is placed in the heating space 120*a*, the heating tube 125 is induction-heated together with the preliminary crucible 122 by the magnetic field formed in the induction coil 121, and since radiant heat is applied to the preliminary crucible 122 through the heating tube 125 heated in this way, the preliminary crucible 122 may be heated more effectively.

However, in order to prevent the heating tube 125 from being cooled by a cooling fluid flowing through the induction coil 121, as illustrated in FIG. 12, it is preferable that the insulating material 124 is disposed between the heating tube 125 and the induction coil 121 and configured to block heat from the heating tube 125 from being transferred to the cooling fluid flowing inside the induction coil 121.

In this case, as the thickness of the insulating material 124 increases, heat exchange between the heating tube 125 and the cooling fluid flowing through the induction coil 121 may be effectively blocked, but when the thickness of the insulating material 124 increases in this way, as the separation distance from the heating tube 125 to the induction coil 121 increases and the density of the magnetic field formed in the induction coil 121 decreases, the degree of heating of the preliminary crucible 122 and the heating tube 125 decreases.

On the other hand, as the thickness of the insulating material 124 decreases, the separation distance from the heating tube 125 to the induction coil 121 decreases, and as the density of the magnetic field formed in the induction coil 121 increases, the degree of heating of the preliminary crucible 122 and the heating tube 125 may increase. However, as the separation distance from the heating tube 125 to the induction coil 121 decreases, the heating tube 125 is cooled by the cooling fluid flowing through the induction coil 121, and thus, the degree of heating of the preliminary crucible 122 and the heating tube 125 is reduced. Therefore, this insulating material 124 needs to be formed to an appropriate thickness.

When the heating efficiency according to the thickness of the insulating material 124 as illustrated in FIG. 13 is reviewed, it can be confirmed that the heating efficiency is the highest at about 96% when the thickness of the insulating material 124 is 20 mm.

In this case, based on a case where the thickness of the insulating material 124 is 20 mm, as the thickness of the insulating material 124 increases, the separation distance from the heating tube 125 to the induction coil 121 increases, and thus, the heating efficiency decreases. In addition, when the thickness of the insulating material 124 is more than 40 mm, it can be confirmed that the heating efficiency is rapidly reduced.

In addition, as the thickness of the insulating material 124 decreases, the heating tube 125 is cooled by the cooling fluid flowing through the induction coil 121, and thus, the heating efficiency decreases. In addition, when the thickness of the insulating material 124 is formed to be less than 13 mm, it can be confirmed that the heating efficiency is rapidly reduced. Therefore, it is preferable that the thickness of the insulating material 124 is formed in the range of 13 mm or more and 40 mm or less.

As described above, since the apparatus for continuously growing an ingot according to an exemplary embodiment of the present invention melts the silicon material in a solid state in the preliminary melting part 100 and supplies the silicon 12 in a molten state to the main crucible, the configuration of the main crucible 11 is simplified, and it is possible to prevent the splashing of silicon in a molten state. In particular, since the preliminary melting part 100 heats the preliminary crucible 122 by an induction heating method, the configuration of the entire apparatus may be simplified.

In addition, since the induction coil 121 is wound to surround the heating space, the interval of the induction coil 121 is tightly wound or is wound such that the inner diameter is reduced, and thus, all parts of the preliminary crucible 122 may be effectively heated. In addition, by providing an insulating material 124 between the induction coil 121 and the preliminary crucible 122, the thickness of the insulating material 124 is formed within a certain range so as to minimize heat loss and maximize the heating efficiency of the preliminary crucible 122.

Although the exemplary embodiments of the present invention have been described, the spirit of the present invention is not limited by the exemplary embodiments presented herein, and a person skilled in the art who understands the spirit of the present invention may easily suggest other exemplary embodiments by modifying, changing, deleting or adding components within the scope of the same spirit, but this will also be within the spirit of the present invention.

The invention claimed is:

1. An apparatus for continuously growing an ingot, comprising:

a growth furnace in which a main crucible, wherein silicon in a molten state is accommodated, is provided to form the ingot;

a material supply part disposed outside the growth furnace and comprising a bucket in a form of a container that is opened upward to accommodate a silicon material in a solid state and configured to supply the silicon material before the silicon material is melted;

a preliminary melting part disposed between the material supply part and the main crucible, the preliminary melting part comprising:

a preliminary crucible disposed inside a heating space, the preliminary crucible being configured to melt the silicon material in the solid state, which is supplied from the material supply part, while being heated within the heating space; and a preliminary crucible heater comprising an induction coil wound around a first axis extending in a transverse direction so as to surround the heating space and configured to heat the preliminary crucible; and a shield formed to surround an outer peripheral surface of the induction coil, wherein a winding direction of the induction coil corresponds to the first axis and is inclined with respect to a second axis extending in a horizontal direction of the preliminary melting part, wherein the preliminary crucible is movable between a first position for accommodating the silicon material in a solid state and a second position for supplying the silicon in a molten state to the main crucible, and wherein, in the first position, an inclination of the preliminary crucible is parallel to the winding direction of the induction coil, and in the second position, the inclination of the preliminary crucible intersects the winding direction of the induction coil;

a blocking plate provided between the material supply part and the preliminary melting part, and configured to prevent a heat loss by being openable, wherein, while the blocking plate is open, the silicon material in the solid state moved from the material supply part in a direction of the preliminary crucible and is introduced into one side of the heating space such that the silicon material in the solid state is supplied to the preliminary crucible, and after the silicon material in the solid state accommodated in the preliminary crucible is melted, the silicon in the molten state moves toward the main crucible and is discharged to the other side of the heating space, thereby being directly supplied to the main crucible.

2. The apparatus of claim 1, wherein the preliminary crucible comprises a body in the form of a container disposed inside the heating space and opened upward to accommodate the silicon material in the solid state, and a beak which is disposed outside the other side of the heating space such that the silicon in the molten state is supplied to the main crucible.

3. The apparatus of claim 2, wherein the induction coil is wound along the periphery of the heating space, and is wound such that a gap between the induction coils that are disposed adjacent to each other along a direction from one side of the heating space to the other side is reduced.

4. The apparatus of claim 2, wherein the induction coil is wound along the periphery of the heating space such that an inner diameter of the induction coil disposed on the other side of the heating space is smaller than an inner diameter of the induction coil disposed on one side of the heating space.

5. The apparatus of claim 1, further comprising:
a power connector which is electrically connected to supply current to the induction coil,
wherein the induction coil is provided with a fastening bracket which is inserted and fixed to the power connector.

6. The apparatus of claim 1, wherein the preliminary crucible is provided with a front support bar and a rear support bar for respectively supporting one side and the other side of a lower portion of the preliminary crucible, and
wherein when the preliminary crucible is moved from the first position to the second position, the rear support bar is formed to move upward while a height of the front support bar is fixed.

7. The apparatus of claim 1, wherein the preliminary crucible heater further comprises an insulating material for blocking heat exchange between the preliminary crucible and the induction coil.

8. The apparatus of claim 7, wherein the preliminary crucible heater further comprises a heating tube which is disposed to surround the preliminary crucible and is formed to extend along a winding direction of the induction coil, and
wherein the insulating material is disposed between the heating tube and the induction coil.

9. The apparatus of claim 7, wherein a thickness of the insulating material is formed in a range of 13 mm or more and 40 mm or less.

* * * * *